(12) United States Patent
Sherwood et al.

(10) Patent No.: US 12,720,912 B2
(45) Date of Patent: Aug. 25, 2026

(54) STRESS RELAXATION TRENCHES FOR GALLIUM NITRIDE MICROLED LAYERS ON SILICON SUBSTRATES

(71) Applicant: Applied Materials, Inc., Santa Clara, CA (US)

(72) Inventors: Tyler Sherwood, Fonda, NY (US); Raghav Sreenivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 443 days.

(21) Appl. No.: 17/745,056

(22) Filed: May 16, 2022

(65) Prior Publication Data

US 2023/0369532 A1 Nov. 16, 2023

(51) Int. Cl.
*H10H 20/01* (2025.01)
*H10H 20/825* (2025.01)
*H10W 42/00* (2026.01)
*H10W 90/00* (2026.01)

(52) U.S. Cl.
CPC .... *H10H 20/01335* (2025.01); *H10W 42/121* (2026.01); *H10W 90/00* (2026.01); *H10H 20/825* (2025.01)

(58) Field of Classification Search
CPC ............... H01L 23/562; H01L 25/0753; H01L 21/02019; H01L 21/02005; H01L 21/0201; H01L 21/302; H01L 21/0254; H10H 20/0133; H10H 20/01335; H10H 20/018; H10P 90/12; H10P 90/126
See application file for complete search history.

(56) References Cited

U.S. PATENT DOCUMENTS 7,598,108 B2 10/2009 Li et al.
10,475,888 B2 11/2019 Dasgupta et al.
2012/0288995 A1* 11/2012 El-Ghoroury ....... H01L 33/0095 438/107
2013/0175671 A1* 7/2013 Renaud ................... H01L 21/78 438/460
2014/0264766 A1* 9/2014 Wang ...................... H01L 22/20 257/620
2019/0393069 A1* 12/2019 Paranjpe ................. H01L 33/62
2020/0083400 A1* 3/2020 Henry ..................... H01L 33/06

* cited by examiner

*Primary Examiner* — Alia Sabur
(74) *Attorney, Agent, or Firm* — Kilpatrick Townsend & Stockton LLP

(57) ABSTRACT

A microLED-quality layer of gallium nitride (GaN) may be formed above a silicon substrate for microLED devices to be formed. Typically, mismatches between the crystal lattice of the GaN and the silicon substrate cause internal stresses that bow the wafer. To relieve these stresses, a pattern of trenches may be etched into the GaN layer between the die or device footprints. These trenches may be etched through the GaN layer, down to the depth of the silicon substrate, or even down into the silicon substrate. Instead of one singular, large wafer with internal stresses, the wafer may thus be divided into multiple small sections with minimal internal stresses. A dielectric gap fill may be applied to fill the trenches, and the resulting wafer may be planarized to expose the surface of the GaN after the gap fill.

19 Claims, 10 Drawing Sheets

200
202

STRESS RELAXATION TRENCHES FOR GALLIUM NITRIDE MICROLED LAYERS ON SILICON SUBSTRATES

TECHNICAL FIELD

This disclosure generally describes gallium nitride microLEDs layers deposited on silicon substrates. More specifically, this disclosure describes techniques for relaxing stress caused by mismatches between gallium nitride layer and a silicon substrate when fabricating microLED devices.

BACKGROUND

High-resolution light-emitting diode (LED) displays can include millions of micron-sized pixels arranged to form a viewing screen. For example, micro-LEDs represent an emerging display technology for flat-panel displays that offer high contrast, response times, and greater energy efficiency than other display types. Micro-LED displays are driven by an array of microscopic LEDs that are arranged to form individual pixel elements.

SUMMARY

In some embodiments, a micro light-emitting diode (microLED) structure mya include a silicon substrate and a gallium nitride (GaN) layer formed above the silicon substrate. The gallium nitride layer may include a plurality of microLED devices. The GaN layer may include a plurality of trenches that extend from a top surface of the GaN layer to a bottom surface of the GaN layer between the plurality of microLED devices.

In some embodiments, a method of reducing stress in wafers for GaN microLED devices may include providing a silicon substrate, forming a GaN layer above the silicon substrate, and forming a plurality of trenches in the GaN layer. The plurality of trenches may extend from a top surface of the GaN layer to a bottom surface of the GaN layer between locations for a plurality of microLED devices on the GaN layer.

In some embodiments, one or more non-transitory computer-readable media may store instructions that, when executed by one or more processors, cause the one or more processors to perform operations comprising causing one or more semiconductor processing chambers to form a GaN layer above the silicon substrate, and causing the one or more semiconductor processing chambers to form a plurality of trenches in the GaN layer. The plurality of trenches may extend from a top surface of the GaN layer to a bottom surface of the GaN layer between locations for a plurality of microLED devices on the GaN layer.

In any embodiments, any and all of the following features may be implemented in any combination and without limitation. The microLED structure may also include one or more buffer layers between the silicon substrate and the GaN layer. The one or more buffer layers may include an aluminum nitride layer. The plurality of trenches may further extend through the one or more buffer layers. The GaN layer may be greater than about 5 μm thick. A topmost 3 μm of the GaN layer may be substantially free of defects. The plurality of trenches may be between about 5 μm and about 15 μm wide. The plurality of trenches may further extend to a top surface of the silicon substrate. The plurality of trenches may further extend below a top surface of the silicon substrate. An isolation layer may be formed over the GaN layer, where the isolation layer may fill the plurality of trenches. A portion of the isolation layer over the GaN layer may be selectively removed to expose the top surface of GaN layer while leaving a portion of the isolation layer that fills the plurality of trenches. The plurality of trenches may be formed between locations for a plurality of dies on the GaN layer, where the microLED devices may be formed on the plurality of dies. The plurality of trenches may be separated by between about 15 mm to about 25 mm. The plurality of trenches may be separate and distinct from scribe lines used to separate plurality of dies from each other. The silicon substrate may be greater than about 250 mm in diameter. The silicon substrate may have a bow displacement of less than about 50 μm after forming the plurality of trenches. The plurality of trenches may form islands of GaN in the GaN layer such that the islands of GaN can expand and contract individually on the silicon substrate in response to temperature variations. An epitaxy process may be used to grow the GaN layer.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

A microLED-quality layer of gallium nitride (GaN) may be formed above a silicon substrate for microLED devices to be formed. Typically, mismatches between the crystal lattice of the GaN and the silicon substrate cause internal stresses that bow the wafer. To relieve these stresses, a pattern of trenches may be etched into the GaN layer such that the areas between the trenches are sized to fit a die shape or a device shape. These trenches may be etched through the GaN layer, down to the depth of the silicon substrate, or even down into the silicon substrate. Instead of one singular, large wafer with internal stresses, the wafer may thus be divided into multiple small sections with minimal internal stresses. A dielectric gap fill may be applied to fill the trenches, and the resulting wafer may be planarized to expose the surface of the GaN after the gap fill.

Figure 1:
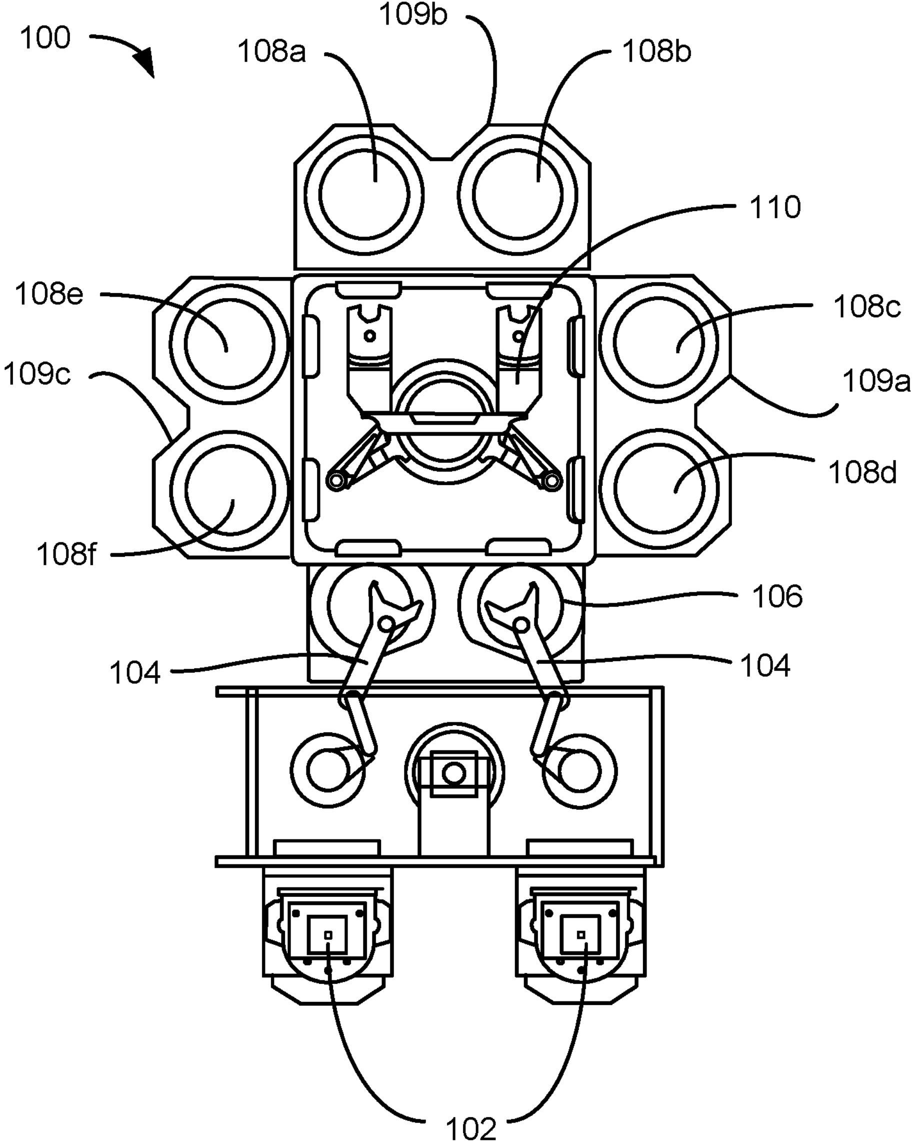
FIG. 1 illustrates a top plan view of a processing system of various semiconductor processing chambers according to some embodiments.

FIG. 1 illustrates a top plan view of one embodiment of a processing system 100 of deposition, etching, cleaning, polishing, baking, curing, etc., chambers according to some embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108*a-f* may include one or more system components for depositing, annealing, curing and/or etching a material film on the substrate or wafer. In one configuration, two pairs of the processing chambers, for example 108*c-d* and 108*e-f*, may be used to deposit material on the substrate, and the third pair of processing chambers, for example 108*a-b*, may be used to cure, anneal, or treat the deposited films. In another configuration, all three pairs of chambers, for example 108*a-f*, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by the processing system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

The processing system 100, or more specifically chambers incorporated into the processing system 100 or other processing systems, may be used to produce structures according to some embodiments of the present technology. For example, the processing system 100 may be used to fabricate the wafers for microLEDs structures described below using processes such as a reactive-ion etch (RIE), chemical-vapor deposition (CVD), chemical-mechanical polishing (CMP), along with other processes.

When fabricating microLED devices, a typical process may deposit a layer gallium nitride (GaN) over a silicon substrate. However, at the time of this disclosure depositing layers of GaN on top of a large silicon substrates is not easily done. For example, silicon substrates measuring 200 mm in diameter rarely include a continuous layer of GaN on top of the silicon substrate because of the inherent stress caused by mismatches between the crystal lattices of the GaN layer and the silicon substrate. Complex engineering processes must be used in order to balance the stress between these two layers. Otherwise, the wafer may bow and/or warp, which may cause problems in downstream processes when additional layers or features are added to the wafer to form the microLED structures.

For example, in order to fabricate a large silicon substrate, a complex set of steps is currently used to balance the stress caused between the GaN layer and the silicon layer. Using a metal-organic chemical vapor deposition MOCVD reactor process, the chamber may be heated to approximately 1100° C. An aluminum nitride buffer layer may first be formed on the silicon substrate, and then additional delocation defect layers and additional buffer layers of aluminum nitride, aluminum gallium nitride, and/or other materials may be formed incrementally on top of the silicon substrate. Instead of inherently reducing the stress, these extra buffer layers have the effect of pre-stressing the silicon substrate in an opposite direction. Later when the gallium nitride epilayer is grown on the substrate, the opposing stresses induced by the buffer layers tend to balance out the opposing stresses induced by the GaN epilayer, resulting in a somewhat uniform wafer.

However, this process tends to increase the internal stresses rather than alleviate the stress in the wafer. When the wafer begins to cool down, the internal stresses present in the wafer may cause the wafer to bow or warp after the GaN epilayer has been formed. For example, MOCVD processes using silicon substrates above 200 mm and using the buffer layer process described above to balance internal stresses still results in a bowl-shaped wafer with as much as 500-600 μm of displacement. Wafers with this much displacement cannot be reliably processed on a precise lithography tool, which is necessary when later forming the microLED structures on the GaN layer. This much bow also prevents the wafer from being accurately leveled on a chemical-mechanical polishing (CMP) station to be compatible with other advanced lithography tools.

The embodiments described herein solve these and other technical problems associated with growing GaN layers on large silicon substrates. Instead of simply balancing the internal stresses using buffer layers, these embodiments pre-pattern trenches into the top of the GaN epilayer after the GaN layer is epitaxially grown on the silicon substrate. For example, trenches may be etched into the GaN layer such that the areas between the trenches are sized to fit a die shape or a device shape. These trenches may be etched down to the bottom of the GaN layer, or even down into the silicon substrate itself. Instead of one singular, large wafer with internal stresses, the wafer is now divided into multiple small sections or islands of GaN with minimal internal stresses. These small sections leave room for expansion/contraction as the wafer is heated/cool during later processes in the semiconductor manufacturing process. By dividing the wafer into smaller islands of GaN on the silicon substrate, the overall stress of the wafer may be minimized. Some embodiments may then apply a dielectric gap fill to fill the trenches with a dielectric or other isolation material, then polish or planarize the resulting wafer to expose the surface of the GaN after the gap fill. In comparison, the bow displacement on the resulting wafer may be less than about 50 μm.

Figure 2:
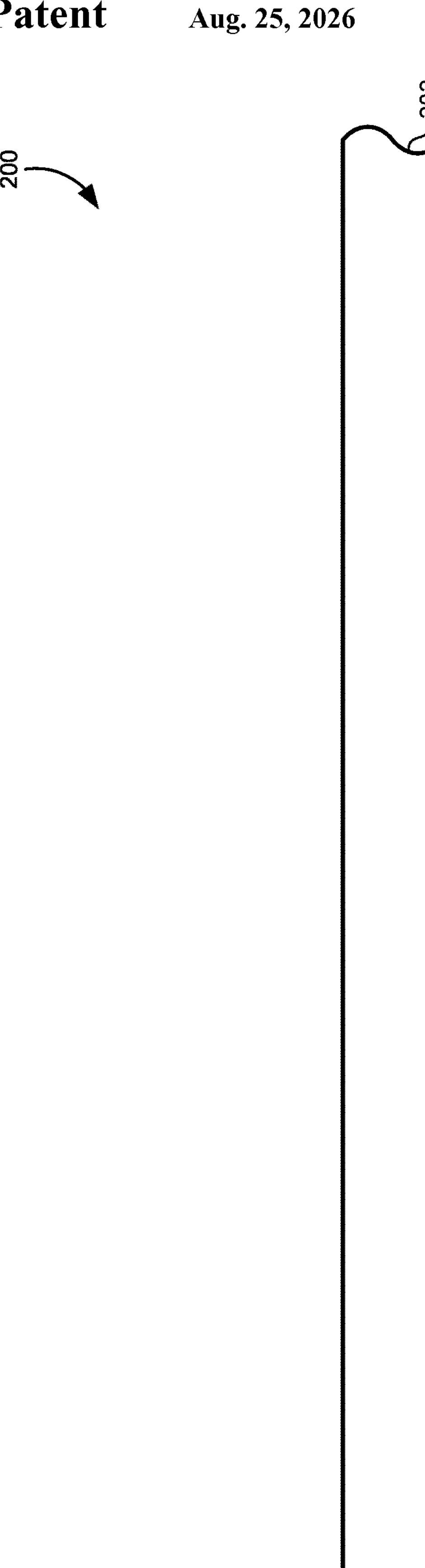
FIG. 2 illustrates a silicon substrate that may be used as a base for growing layers for microLEDs devices, such as a microLED-quality GaN layer for fabricating microLED devices, according to some embodiments.
Figure 2:

FIG. 2 illustrates a silicon substrate 202 that may be used as a base for growing layers for microLEDs devices, such as a microLED-quality GaN layer for fabricating microLED devices, according to some embodiments. The silicon substrate 202 may be any dimension, and thus only a portion of the silicon substrate 202 is illustrated in FIG. 2 for the sake of clarity. Specifically, as subsequent figures illustrate additional layers on the silicon substrate 202, only a portion of a cross-sectional view of the silicon substrate 202 will be shown in order to highlight the features of these different layers, such as trench depth. It should also be understood that these cross sectional views are not drawn to scale in order to show multiple features together, such as the etched trenches, which would be space much further apart in practice.

In some embodiments, the silicon substrate 202 may be distinguished from other silicon substrates based on the size of the silicon substrate 202. As described above, current processes may struggle to fabricate wafers with microLED-quality GaN layers on silicon substrates that are more than approximately 200 mm in diameter. Therefore, this silicon substrate 202 may be distinguished from other silicon substrates by being, for example, greater than about 200 mm in diameter, greater than about 225 mm in diameter, greater than about 250 mm in diameter, greater than about 275 mm in diameter, greater than about 300 mm in diameter, greater than about 325 mm in diameter, greater than about 350 mm in diameter, and so forth, depending on the embodiment. As described above, current processes that rely on balancing internal stresses using multiple buffer layers cannot reliably and reproducibly manufacture wafers in these size ranges.

Figure 3:
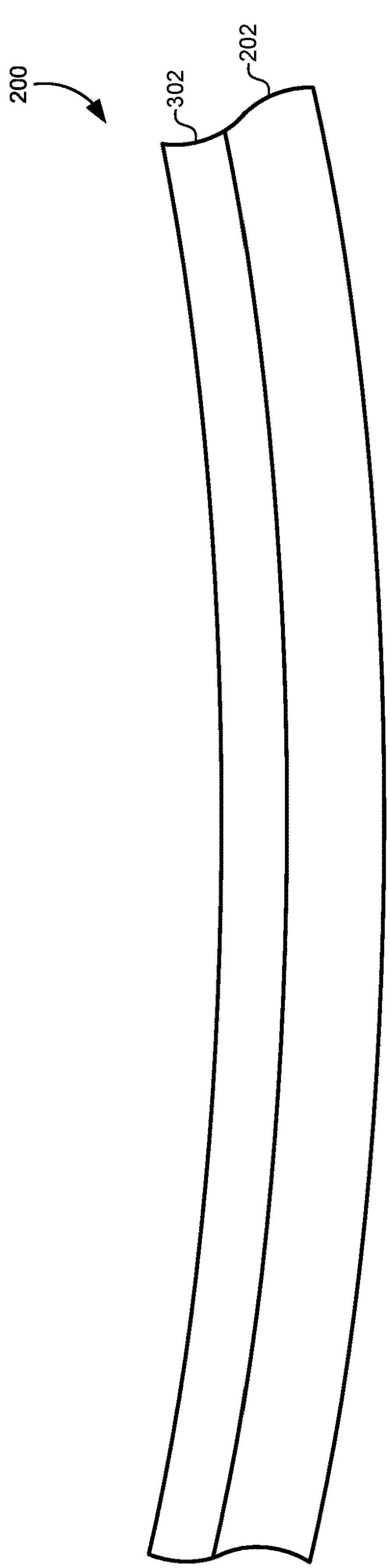
FIG. 3 illustrates a GaN layer that has been formed on the silicon substrate, according to some embodiments.

FIG. 3 illustrates a GaN layer 302 that has been formed on the silicon substrate 202, according to some embodiments. Although not shown explicitly in FIG. 3, the wafer 200 may include one or more buffer layers between the GaN layer 302 and the silicon substrate 202. These buffer layers may include a layer of aluminum nitride on which the GaN layer 302 may be grown using an epitaxy process. However, these embodiments need not require the careful engineering required to balance stresses between the buffer layers, the GaN layer 302 and the silicon substrate 202, since these internal stresses will be alleviated using the etched trenches as described below. Therefore, in some embodiments, the crystal lattice mismatch between the GaN layer 302 and the silicon substrate 202 may cause the wafer 200 to bow as illustrated in FIG. 3. Note that the bow illustrated in FIG. 3 is greatly exaggerated to illustrate this effect.

The GaN layer 302 may be distinguished from other GaN layers in that the GaN layer 302 may be a microLED-grade GaN epilayer. When the GaN layer 302 is grown on, for example, an aluminum nitride buffer layer, the GaN layer 302 may begin growing with defects caused by the buffer layer. These defects may continue for the first few hundred nanometers of the GaN layer 302, and may extend up to the first micron or so of the GaN layer 302. However, as the GaN layer 302 continues to grow, these defects may self-terminate such that the upper layers of the GaN layer 302 are defect-free. To be considered "microLED-grade" GaN), the GaN layer 302 may have the top 3 μm, top 4 μm, top 5 μm, top 6 μm, top 7 μm, and so forth, to be defect free. Thus, the overall thickness of the GaN layer 302 may be greater than about 5 μm, greater than about 6 μm, greater than about 7 μm, greater than about 8 μm, greater than about 10 μm, and so forth, depending on the embodiment and requirements for the microLEDs devices. These defect-free layers may be needed to grow the multi-quantum levels that are used for photon emission in the microLEDs. However, this increased thickness also increases the stress on the wafer 200. Note that the "microLED-grade" GaN of this thickness may be distinguished from GaN used in power applications, which typically is much thinner (e.g., less than about 4 μm thick) were defects are more acceptable.

Figure 4A:
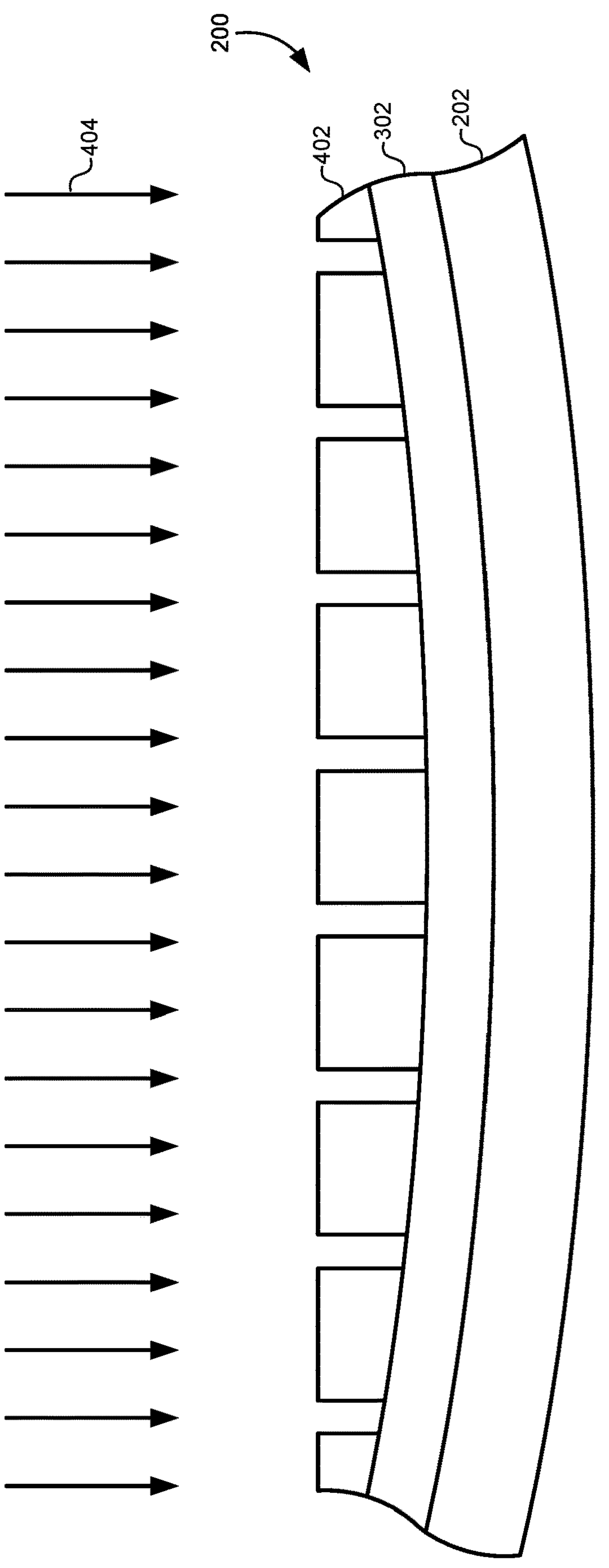
FIG. 4A illustrates the wafer with a layer of photoresist pattered to etch the trenches for relieving the stress on the wafer, according to some embodiments.

FIG. 4A illustrates the wafer 200 with a layer of photoresist 402 pattered to etch the trenches for relieving the stress on the wafer 200, according to some embodiments. As described above, the wafer 200 may have a bow induced by the crystal lattice mismatch of the GaN layer 302 and the silicon substrate 202. However, certain lithography processes may allow for a bowed wafer 200 when etching patterns that do not have strict requirements. For example, an I-line lithography process may be used, which can handle wafer imperfections when forming larger features like the trenches described herein. A layer of photoresist 402 with patterns that expose the GaN layer 302 maybe spot on the GaN layer 302 to define where the trenches will be etched. The layer of photoresist 402 may be about 4 μm to about 5 μm thick. The I-line lithography process may then be used to etch the trenches in the GaN layer 302. Note that other etch processes may be also used. The I-line lithography process is provided only by way of example and is not meant to be limiting.

Figure 4B:
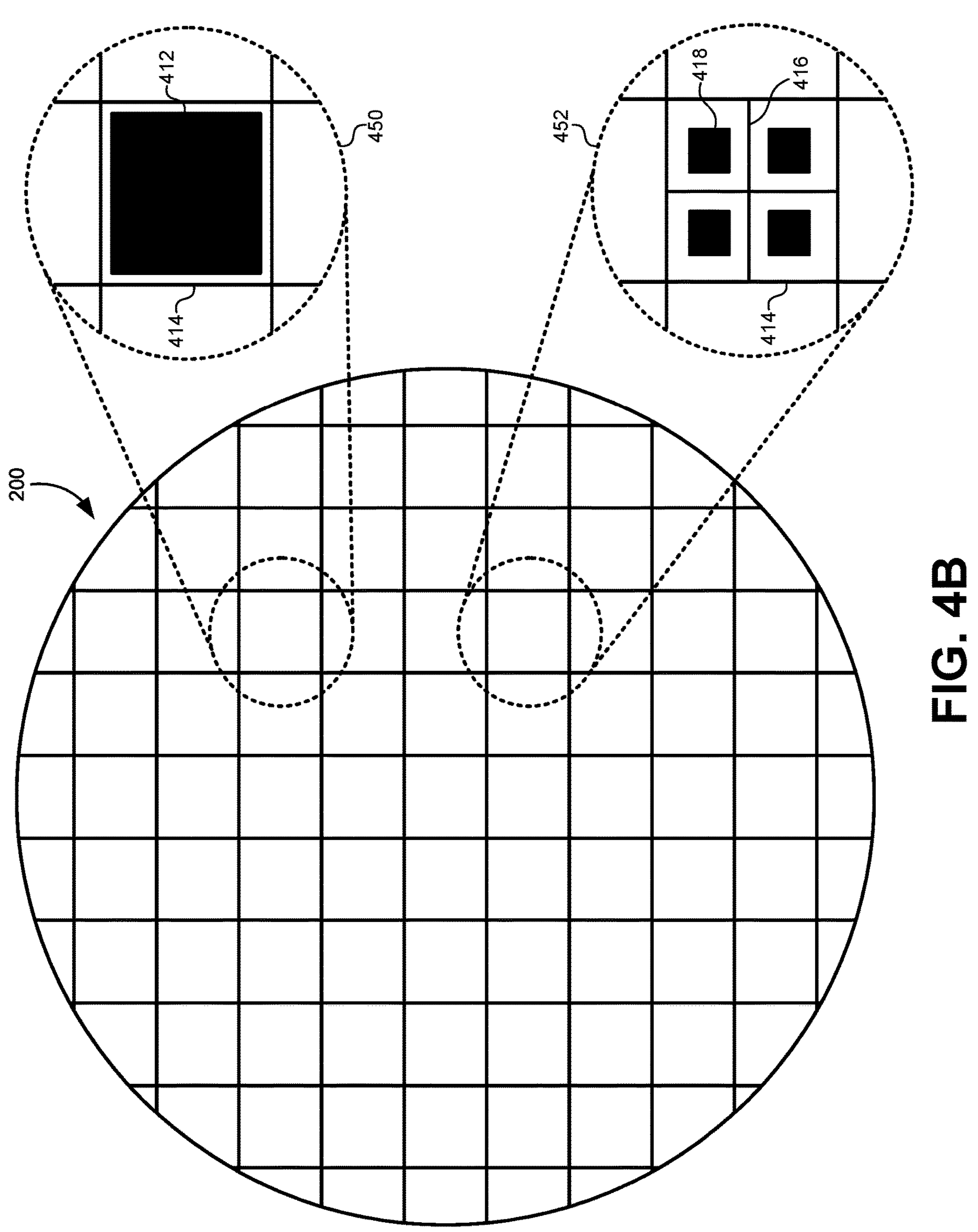
FIG. 4B illustrates an overhead view of the wafer, according to some embodiments.

FIG. 4B illustrates an overhead view of the wafer 200, according to some embodiments. In order to determine the pattern for the trenches 414 in the photoresist layer, some embodiments may pattern the photoresist based on a size. For example, view 450 illustrates a zoomed-in portion of the pattern on the wafer 200 for the trenches 414. If the wafer 200 includes a plurality of dies, such as the die 412 illustrated in view 450, the trenches 414 may be patterned such that the die fits within the trenches 414. The die size may include a border around the printed pattern of the die such that the dies can be separated from one another. For example, a die size of about 20×20 mm may result in a pattern for the trenches 414 that is also 20×20 mm in a square pattern. Note that the trenches 414 may be separate and distinct from a scribe line that is later formed in the wafer 200 in order to physically separate the individual dies from each other to be individually packaged. The trenches 414 may be distinguished from a scribe line in that the trenches are typically much wider (e.g., 10 μm wide) and the trenches 414 extend through the GaN layer 302 as illustrated in the figures below.

Along with configuring the pattern of the trenches 414 based on a die size, some embodiments may alternatively or additionally pattern the trenches 414 based on a device size within each die. For example, if individual microLED devices within each die are about 1×1 mm, then the pattern of the trenches 414 may also be defined to be about 1×1 mm in a similar pattern as illustrated in FIG. 4B. View 452 illustrates how the trenches 414 may be patterned around the die size, and additional trenches 416 may be patterned around the individual devices 418 within a die. Note that these trenches 414, 416 may both be used in any combination and without limitation on the wafer 200. For example, the wafer 200 may include a die 412 with a pattern of trenches 414 that enclose the die 412, while also including a pattern trenches 416 that enclose the devices 418 within another die.

Figure 5:
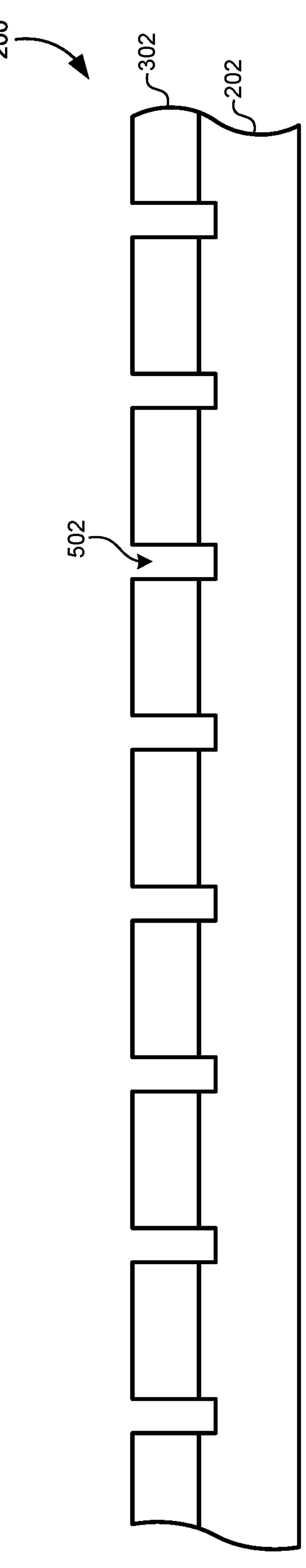
FIG. 5 illustrates a wafer after trenches have been etched in the GaN layer, according to some embodiments.

FIG. 5 illustrates a wafer 200 after trenches 502 have been etched in the GaN layer 302, according to some embodiments. Varying widths may be used for the trenches 502. Some embodiments may use a trench width of between about 5 μm and about 10 μm, between about 10 μm and about 15 μm, between about 15 μm and about 20 μm, and so forth, depending on the embodiment. For example, the I-line lithography process described above may be configured to use a trench width of about 10 μm.

The depth of the trenches 502 may be such that the trenches 500 into extend from a top surface of the GaN layer 302 down to approximately a bottom surface of the GaN layer 302. For example, the trenches 502 may be etched until the trenches 502 reach the buffer layers between the GaN layer 302 and the silicon substrate 202. Some embodiments may further etch the trenches 502 through the buffer layers until a top surface of the silicon substrate 202 is reached. For example, an endpoint for the etch process may be based on exposing the top surface of the silicon substrate 202. Some embodiments may still further etch the trenches 502 into the silicon substrate 202. This may ensure that the islands of the GaN layer 302 between the trenches 502 are physically separated from each other. For example, the depth of the etch may extend about 1 μm into the silicon substrate, about 2 μm into the silicon substrate, about 3 μm into the silicon substrate, and so forth, depending on the embodiment.

Creating individual islands of the GaN layer 302 allows these islands to expand/contract more freely during temperature variations, such as during an annealing process that may be performed on the wafer 200 in later stages of the manufacturing process for forming the microLED structures. For example, the GaN layer 302 may have a different coefficient of thermal expansion (CTE) than a CTE of the silicon substrate 202, causing the GaN layer 302 to expand/contract more or less than the silicon substrate 202 as the temperature varies. By creating independent islands in the GaN layer 302, these islands can expand and contract individually with temperature variations rather than causing the entire wafer 200 to expand and contract as whole, thereby causing a bow in the wafer 200.

Figure 6:
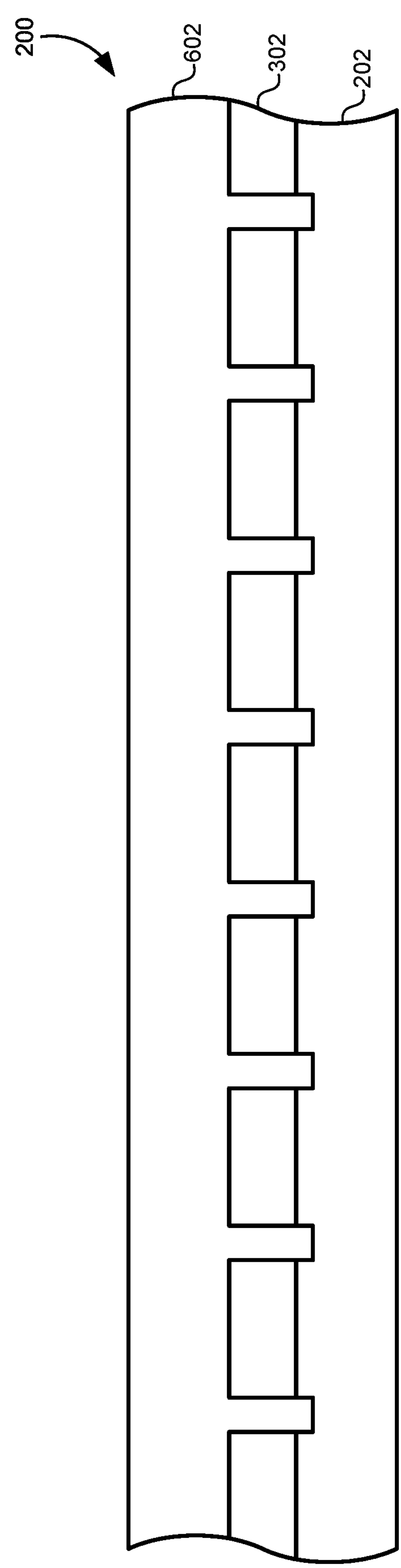
FIG. 6 illustrates a wafer with a isolation layer filling the trenches, according some embodiments.

FIG. 6 illustrates a wafer 200 with a isolation layer 602 filling the trenches 502, according some embodiments. Some embodiments may optionally fill the trenches 502 with an isolation layer 602 in order to provide a level surface for downstream processing operations on the wafer 200. Filling the trenches 502 also isolates the islands of the GaN layer 302. Any deposition process may be used to deposit the isolation layer 602, such as a chemical vapor deposition (CVD) process. Various materials may be used for the isolation layer 602, such as oxide materials, nitride materials, other dielectric materials, and so forth. The isolation layer 602 may fill the trenches 502 with the isolation material. Some embodiments may also cover the GaN layer 302 with the isolation layer 602.

Figure 7:
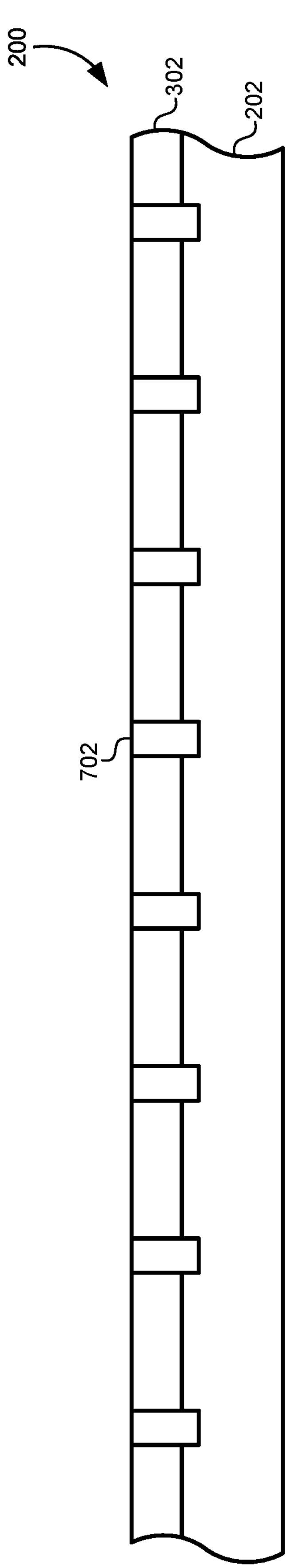
FIG. 7 illustrates the wafer after a planarization process to remove the excess isolation layer, according to some embodiments.

FIG. 7 illustrates the wafer 200 after a planarization process to remove the excess isolation layer 602, according to some embodiments. For example, a chemical-mechanical polishing (CMP) process may be used to gradually remove the excess isolation layer 602. The CMP process may polish away the isolation layer 602 until the top surface of the GaN layer 302 is exposed. The remaining portion of the isolation layer 702 may be found in the trenches. Note that the depth of the remaining portion of the isolation layer 702 may correspond to the depth of the trenches etched in the wafer 200 in FIG. 5 as described above. Thus, the remaining portion of the isolation layer 702 may extend from the top surface of the GaN layer 302 down to a bottom surface of the GaN layer 302, down to a top surface of the silicon substrate 202, or down below the top surface of the silicon substrate 202, depending on the embodiment.

Figure 8:
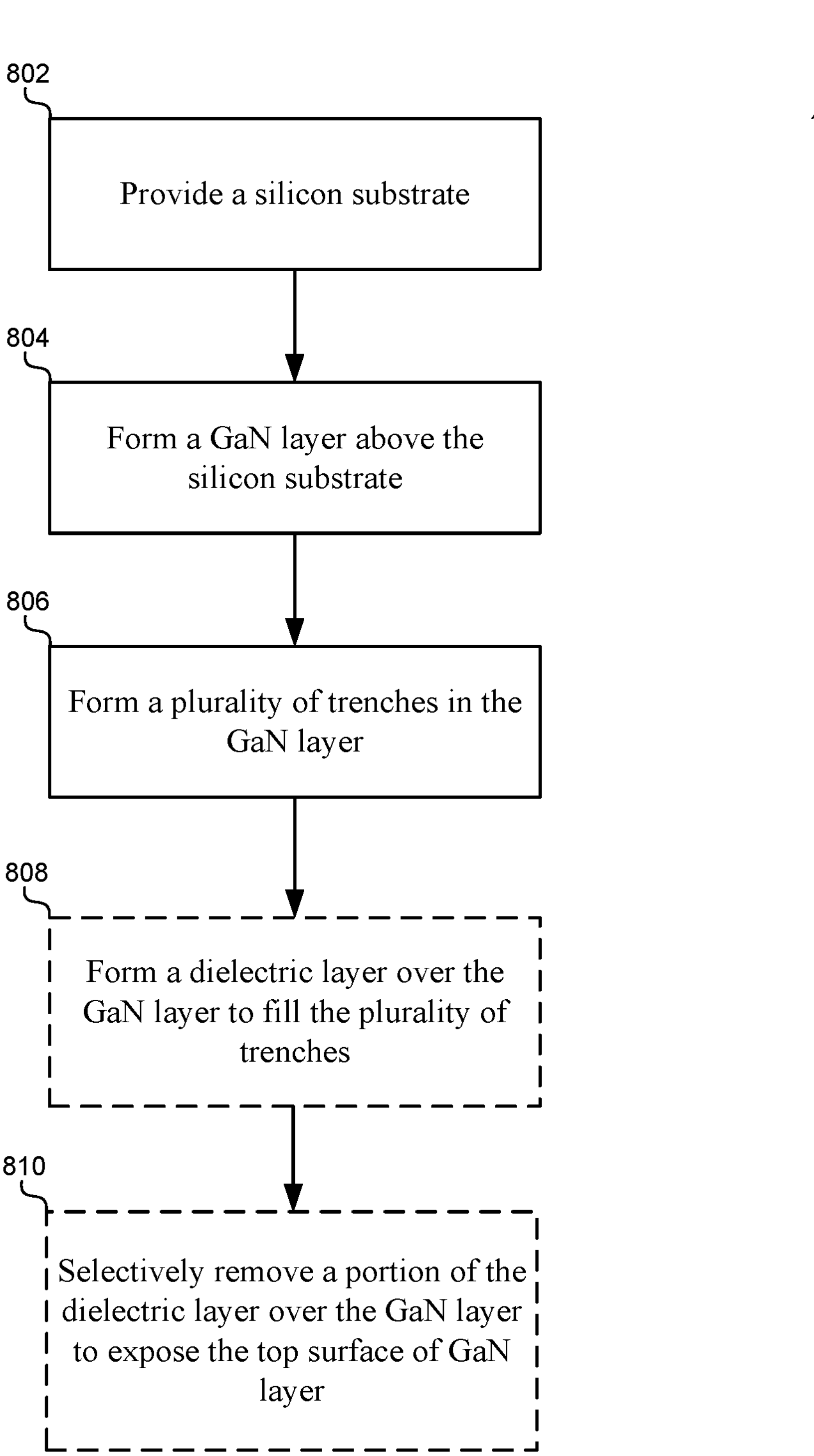
FIG. 8 illustrates a flowchart of a method for reducing stress in wafers for GaN microLED structures, according to some embodiments.

FIG. 8 illustrates a flowchart 800 of a method for reducing stress in wafers for GaN microLED structures, according to some embodiments. This method may be performed by one or more semiconductor processing chambers, such as those described above in relation to FIG. 1. For example, individual steps in this method may be performed by different semiconductor processing chambers in a semiconductor processing system. In some embodiments, the method steps may be represented by instructions stored on computer-readable media that are executed by one or more processors in the computer systems that control the semiconductor processing chambers. For example, these instructions may be found in a recipe or other set of instructions that program or control the operation of the semiconductor processing chambers.

The method may include providing a silicon substrate (802). The silicon substrate may be used as a substrate for forming microLEDs devices or dies. In some cases, the silicon substrate may be characterized as being greater than about 250 mm in diameter. For example, the silicon substrate may be provided as illustrated above in FIG. 2.

The method may further include forming a GaN layer above the silicon substrate (804). In some embodiments, one or more buffer layers, such as an aluminum nitride buffer layer may be formed between the silicon substrate and the GaN layer. The GaN layer may be characterized as microLED-quality GaN, being greater than about 5 μm thick, with a topmost 3 μm of the GaN layer being substantially free of defects (e.g., less than 0.5% defects). The GaN layer may be formed as illustrated above in FIG. 3.

The method may additionally include forming a plurality of trenches in the GaN layer (806). The plurality of trenches may extend through the GaN layer. For example, the trenches may extend from a top surface of the GaN layer to a bottom surface of the GaN layer. In some embodiments, the trenches may further extend through the any buffer layers to expose a top surface of the silicon substrate. Some embodiments may allow the trenches to further extend below the top surface of the silicon substrate into the silicon substrate itself. The trenches may be between about 5 μm and about 15 μm wide. A pattern used for the trenches may be based on areas of dies and/or individual devices that will be formed on the GaN layer, and thus the pattern for the trenches may be based on each individual wafer layout. For example, the trenches may run between locations for a plurality of microLED devices on the GaN layer that are separated by about 15 mm to about 25 mm. Note that the microLEDs devices will not yet be present on the GaN layer since they have not yet been formed. Instead, the locations for future placement of these microLED devices may define the pattern for the trenches. The trenches may be formed by spinning a layer of photoresist with the trench pattern on the GaN layer and performing an etch process, such as an I-line etch process that allows for a bow in the wafer resulting from the crystal lattice mismatch between the GaN layer and the silicon substrate. The plurality of trenches be formed as described above in FIGS. 4A-5.

The method may optionally include forming an isolation layer over the GaN layer to fill the plurality of trenches (808). The isolation layer may be formed using a dielectric material, such as a nitride material or an oxide material and using any deposition process, such as a CVD process. The method may then include selectively removing the isolation layer over the GaN layer to expose the top surface of the GaN layer (810). For example, a CMP process may polish the isolation layer until it is level with the top surface of the GaN layer, while leaving a portion of the isolation layer to fill the trenches. The isolation layer may be formed and polished as described above in FIGS. 6-7.

It should be appreciated that the specific steps illustrated in FIG. 8 provide particular methods of forming trenches to leave stresses in microLED wafers according to various embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 9:
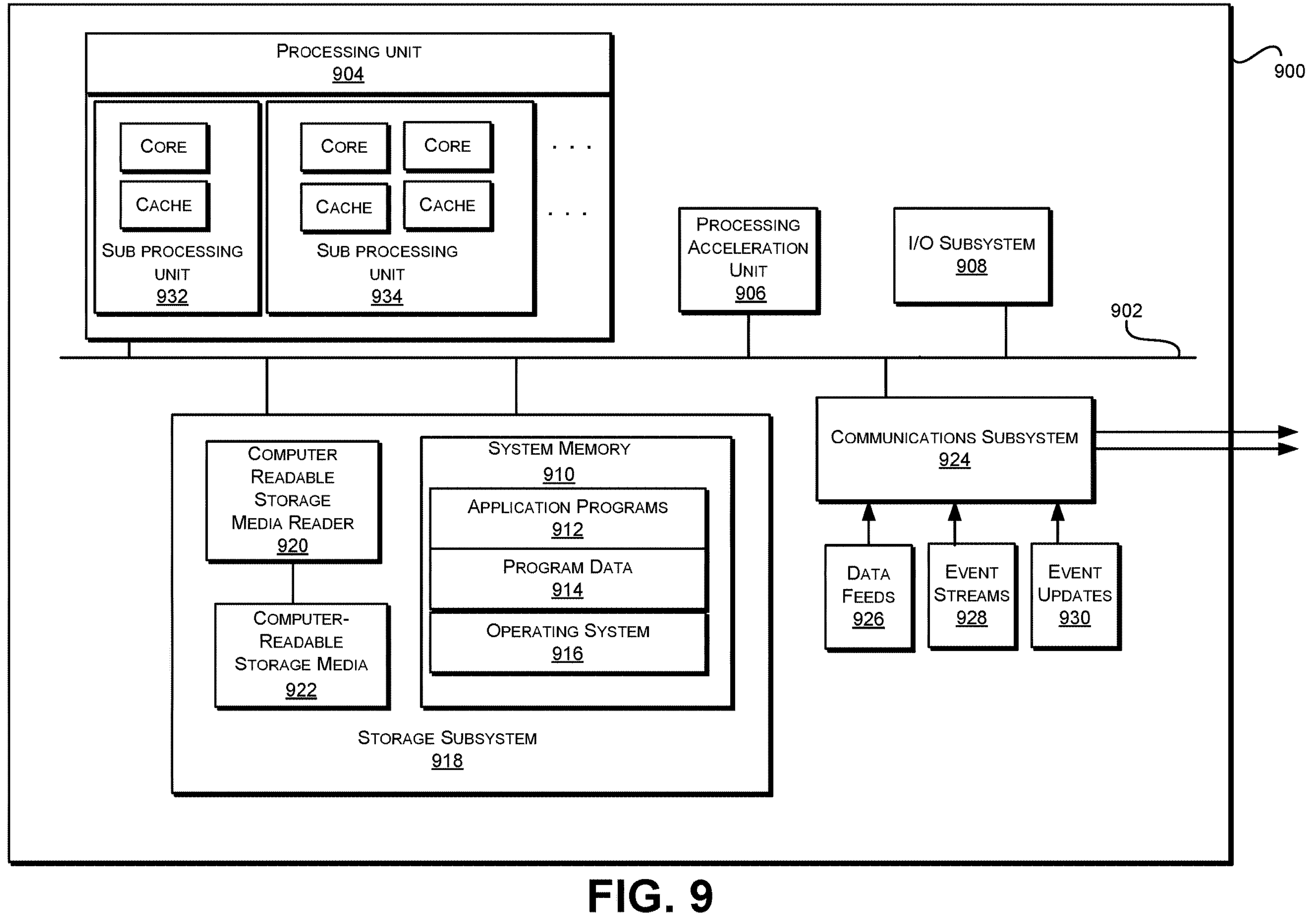
FIG. 9 illustrates an exemplary computer system, in which various embodiments may be implemented.

FIG. 9 illustrates an exemplary computer system 900, in which various embodiments may be implemented. The system 900 may be used to implement any of the computer systems described above. For example, the computer system 900 may be used as a controller for the semiconductor processing system for one or more of the semiconductor processing chambers described above in relation to FIG. 1. As shown in FIG. 9, computer system 900 includes a processing unit 904 that communicates with a number of peripheral subsystems via a bus subsystem 902. These peripheral subsystems may include a processing acceleration unit 906, an I/O subsystem 908, a storage subsystem 918 and a communications subsystem 924. Storage subsystem 918 includes tangible computer-readable storage media 922 and a system memory 910.

Bus subsystem 902 provides a mechanism for letting the various components and subsystems of computer system 900 communicate with each other as intended. Although bus subsystem 902 is shown schematically as a single bus, alternative embodiments of the bus subsystem may utilize multiple buses. Bus subsystem 902 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 904, which can be implemented as one or more integrated circuits (e.g., a conventional microprocessor or microcontroller), controls the operation of computer system 900. One or more processors may be included in processing unit 904. These processors may include single core or multicore processors. In certain embodiments, processing unit 904 may be implemented as one or more independent processing units 932 and/or 934 with single or multicore processors included in each processing unit. In other embodiments, processing unit 904 may also be implemented as a quad-core processing unit formed by integrating two dual-core processors into a single chip.

In various embodiments, processing unit 904 can execute a variety of programs in response to program code and can maintain multiple concurrently executing programs or processes. At any given time, some or all of the program code to be executed can be resident in processor(s) 904 and/or in storage subsystem 918. Through suitable programming, processor(s) 904 can provide various functionalities described above. Computer system 900 may additionally include a processing acceleration unit 906, which can include a digital signal processor (DSP), a special-purpose processor, and/or the like.

I/O subsystem 908 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 900 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 900 may comprise a storage subsystem 918 that comprises software elements, shown as being currently located within a system memory 910. System memory 910 may store program instructions that are loadable and executable on processing unit 904, as well as data generated during the execution of these programs.

Depending on the configuration and type of computer system 900, system memory 910 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 904. In some implementations, system memory 910 may include multiple different types of memory, such as static random access memory (SRAM) or dynamic random access memory (DRAM). In some implementations, a basic input/output system (BIOS), containing the basic routines that help to transfer information between elements within computer system 900, such as during start-up, may typically be stored in the ROM. By way of example, and not limitation, system memory 910 also illustrates application programs 912, which may include client applications, Web browsers, mid-tier applications, relational database management systems (RDBMS), etc., program data 914, and an operating system 916. By way of example, operating system 916 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 918 may also provide a tangible computer-readable storage medium for storing the basic programming and data constructs that provide the functionality of some embodiments. Software (programs, code modules, instructions) that when executed by a processor provide the functionality described above may be stored in storage subsystem 918. These software modules or instructions may be executed by processing unit 904. Storage subsystem 918 may also provide a repository for storing data used in accordance with some embodiments.

Storage subsystem 900 may also include a computer-readable storage media reader 920 that can further be connected to computer-readable storage media 922. Together and, optionally, in combination with system memory 910, computer-readable storage media 922 may comprehensively represent remote, local, fixed, and/or removable storage devices plus storage media for temporarily and/or more permanently containing, storing, transmitting, and retrieving computer-readable information.

Computer-readable storage media 922 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 900.

By way of example, computer-readable storage media 922 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, and Blu-Ray® disk, or other optical media. Computer-readable storage media 922 may include, but is not limited to, Zip® drives, flash memory cards, universal serial bus (USB) flash drives, secure digital (SD) cards, DVD disks, digital video tape, and the like. Computer-readable storage media 922 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 900.

Communications subsystem 924 provides an interface to other computer systems and networks. Communications subsystem 924 serves as an interface for receiving data from and transmitting data to other systems from computer system 900. For example, communications subsystem 924 may enable computer system 900 to connect to one or more devices via the Internet. In some embodiments communications subsystem 924 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 924 can provide wired network connectivity (e.g., Ethernet) in addition to or instead of a wireless interface.

In some embodiments, communications subsystem 924 may also receive input communication in the form of structured and/or unstructured data feeds 926, event streams 928, event updates 930, and the like on behalf of one or more users who may use computer system 900.

By way of example, communications subsystem 924 may be configured to receive data feeds 926 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 924 may also be configured to receive data in the form of continuous data streams, which may include event streams 928 of real-time events and/or event updates 930, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 924 may also be configured to output the structured and/or unstructured data feeds 926, event streams 928, event updates 930, and the like to one or more databases that may be in communication with one or more streaming data source computers coupled to computer system 900.

Computer system 900 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 900 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A micro light-emitting diode (microLED) structure comprising:

a silicon substrate;

a gallium nitride (GaN) layer with an exposed top surface that is formed above the silicon substrate, wherein:

the gallium nitride layer comprises locations for a plurality of microLED devices within a plurality of dies on the silicon substrate;

the GaN layer comprises a plurality of trenches that extend from the exposed top surface of the GaN layer to a bottom surface of the GaN layer;

the plurality of trenches comprises first trenches that isolate the plurality of dies from each other on the silicon substrate;

the plurality of trenches comprises second trenches that isolate the locations for the plurality of microLED devices from each other within the plurality of dies; and an isolation layer filling the plurality of trenches to isolate the locations for the plurality of microLED devices from each other and to isolate the plurality of dies from each other.

2. The microLED structure of claim 1, further comprising one or more buffer layers between the silicon substrate and the GaN layer.

3. The microLED structure of claim 2, wherein the one or more buffer layers comprises an aluminum nitride layer.

4. The microLED structure of claim 2, wherein the plurality of trenches further extend through the one or more buffer layers.

5. The microLED structure of claim 1, wherein the GaN layer is greater than 5 μm thick.

6. The microLED structure of claim 5, wherein a topmost 3 μm of the GaN layer is free of defects.

7. The microLED structure of claim 1, wherein the plurality of trenches are between 5 μm and 15 μm wide.

8. The microLED structure of claim 1, wherein the plurality of trenches further extend to a top surface of the silicon substrate.

9. The microLED structure of claim 1, wherein the plurality of trenches further extend below a top surface of the silicon substrate.

10. A method of reducing stress in wafers for gallium nitride (GaN) microLED devices, the method comprising:

providing a silicon substrate;

forming a GaN layer above the silicon substrate, wherein the GaN layer comprises locations for a plurality of microLED devices within a plurality of dies on the silicon substrate;

forming a mask layer directly on the GaN layer; and after forming the mask layer directly on the GaN layer, forming a plurality of trenches in the GaN layer and the mask layer, wherein:

the plurality of trenches extend from a top surface of the mask layer to a bottom surface of the GaN layer;

the plurality of trenches comprises first trenches that isolate the plurality of dies from each other on the silicon substrate; and the plurality of trenches comprises second trenches that isolate the locations for the plurality of microLED devices from each other within the plurality of dies.

11. The method of claim 10, further comprising forming an isolation layer over the GaN layer, wherein the isolation layer fills the plurality of trenches.

12. The method of claim 11, further comprising selectively removing a portion of the isolation layer over the GaN layer to expose a top surface of GaN layer while leaving a portion of the isolation layer that fills the plurality of trenches.

13. The method of claim 10, wherein the plurality of trenches are separated by between 15 mm to 25 mm.

14. The method of claim 10, wherein the plurality of trenches are separate and distinct from scribe lines used to separate the plurality of dies from each other.

15. The method of claim 10, wherein the silicon substrate is greater than 250 mm in diameter.

16. The method of claim 15, wherein the silicon substrate has a bow displacement of less than 50 μm after forming the plurality of trenches.

17. The method of claim 10, wherein the plurality of trenches form islands of GaN in the GaN layer such that the islands of GaN can expand and contract individually on the silicon substrate in response to temperature variations.

18. One or more non-transitory computer-readable media comprising instructions that, when executed by one or more processors, cause the one or more processors to perform operations comprising:

causing one or more semiconductor processing chambers to form a GaN layer above a silicon substrate, wherein the GaN layer comprises locations for a plurality of microLED devices within a plurality of dies on the silicon substrate;

causing the one or more semiconductor processing chambers to form a mask layer on the GaN layer; and causing the one or more semiconductor processing chambers to form a plurality of trenches in the mask layer and the GaN layer, wherein:

the plurality of trenches extend from a top surface of the mask layer to a bottom surface of the GaN layer;

the plurality of trenches comprises first trenches that isolate the plurality of dies from each other on the silicon substrate; and the plurality of trenches comprises second trenches that isolate the between locations for the plurality of microLED devices on the GaN layer from each other within the plurality of dies.

19. The one or more non-transitory computer-readable media of claim 18, wherein causing one or more semiconductor processing chambers to form the GaN layer comprises causing the one or more semiconductor processing chambers to perform an epitaxy process to grow the GaN layer.

* * * * *